(12) United States Patent
Wagner

(10) Patent No.: US 6,459,578 B1
(45) Date of Patent: Oct. 1, 2002

(54) CHASSIS HAVING REDUCED ACOUSTIC NOISE AND ELECTROMAGNETIC EMISSIONS AND METHOD OF COOLING COMPONENTS WITHIN A CHASSIS

(75) Inventor: Guy R Wagner, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/841,458

(22) Filed: Apr. 24, 2001

(51) Int. Cl.[7] ................................................ H05K 7/20
(52) U.S. Cl. .................... 361/694; 361/688; 361/689; 361/690; 361/695; 174/16.1; 165/104.33; 165/104.34; 454/184
(58) Field of Search ................................ 361/687, 688, 361/690, 695, 692, 694; 174/15.1, 16.1, 16.3; 165/80.2, 80.3, 122, 104.33, 104.34; 454/184

(56) References Cited

U.S. PATENT DOCUMENTS

| | | | | |
|---|---|---|---|---|
| 4,489,363 A | * | 12/1984 | Goldberg | .................... 361/693 |
| 5,119,270 A | | 6/1992 | Bolton et al. | |
| 5,377,275 A | * | 12/1994 | Suzuki | ........................ 381/71 |
| 5,544,012 A | * | 8/1996 | Koike | ......................... 361/695 |
| 5,785,116 A | | 7/1998 | Wagner | |
| 5,822,188 A | | 10/1998 | Bullington | |
| 6,038,128 A | | 3/2000 | Hood, III et al. | |
| 6,061,237 A | | 5/2000 | Sands et al. | |
| 6,064,571 A | | 5/2000 | Noble | |
| 6,094,345 A | | 7/2000 | Diemunsch | |
| 6,113,485 A | * | 9/2000 | Marquis et al. | ............. 454/184 |
| 6,134,108 A | | 10/2000 | Patel et al. | |
| 6,198,627 B1 | * | 3/2001 | Roehling et al. | ........... 361/688 |
| 6,226,182 B1 | * | 5/2001 | Machara | ..................... 361/695 |
| 6,283,246 B1 | * | 9/2001 | Nishikawa | .................. 181/255 |

* cited by examiner

Primary Examiner—Doris Chervinsky

(57) ABSTRACT

A chassis for housing components includes a shell having an intake duct and an exhaust duct. The intake duct is coupled to an intake port for directing cooling air from the intake port into the chassis, and the exhaust duct is coupled to an exhaust port for directing cooling air out of the chassis. The intake duct and the exhaust duct include active and/or passive noise attenuating features for attenuating noise generated within the chassis, which allows the chassis to operate more quietly. The ducts are also dimensioned to attenuate electromagnetic radiation generated within the chassis, which prevents the escape of electromagnetic radiation from the chassis.

18 Claims, 5 Drawing Sheets

CHASSIS HAVING REDUCED ACOUSTIC NOISE AND ELECTROMAGNETIC EMISSIONS AND METHOD OF COOLING COMPONENTS WITHIN A CHASSIS

BACKGROUND OF THE INVENTION

1. Field of the Invention

The present invention relates to a chassis having reduced acoustic noise and electromagnetic emissions, and to a method of cooling components within a chassis.

2. Background Art

Conventional electrical and electronic components generate considerable heat energy during operation. Such components are frequently housed in a chassis, which restricts the amount of ambient cooling air flow available to cool the components, resulting in high temperatures within the chassis. This condition is undesirable because high temperatures negatively affect the performance of electrical and electronic components, and can damage or shorten the life of a component if the temperature of the component becomes too high.

The heat generation problem has grown in significance because of the increased power requirements, and therefore increased heat generation, of modern electrical and electronic components. For example, the processing power of computers has increased dramatically in recent years, which has resulted in higher heat generation from components mounted on computer motherboards.

One conventional solution to the problem of heat generation is the use of cooling fans within a chassis to cool components within the chassis. While fans are effective for cooling electrical and electronic components, they generate acoustic noise during operation, which is undesirable. Acoustic noise is distracting to an operator, and the acoustic noise emanating from a large number of chassis negatively affects worker efficiency. Further, as components become more powerful, and generate more heat, larger and more powerful fans are required to cool the components within a chassis, which generates even more acoustic noise. Therefore, there is a practical limit to the amount that chassis cooling capacity can be increased by using larger, more powerful fans.

In addition to the large heat generation by modern electrical and electronic components, components also generate electromagnetic radiation during operation. Electromagnetic radiation is undesirable because it may interfere with radio, television, telephone, etc. transmissions, and many electronic devices are therefore subject to regulation by the Federal Communications Commission (FCC). FCC regulations restrict the amount of various types of radiation that a chassis can emit into the surrounding environment.

Conventional techniques for restricting the amount of electromagnetic radiation emitted by a chassis render it more difficult to cool components within the chassis, and ultimately result in a chassis that generates more acoustic noise. For example, one conventional solution is to place grilles over a chassis' air intake port and air exhaust port, the grilles being designed to restrict the escape of electromagnetic radiation out of the chassis. A conventional grille includes several small holes for admitting cooling air into and out of the chassis, the diameter of the holes being chosen to prevent the escape of electromagnetic radiation from the chassis. While a small hole diameter for the grilles controls the escape of electromagnetic radiation from the chassis, it negatively affects the chassis' cooling capacity. This occurs because the small holes in the grilles impair the flow of cooling air into and out of the chassis, and therefore larger, faster, more powerful fans must be employed in order to draw air through the chassis for cooling. The larger fans generate more acoustic noise, which is undesirable.

Therefore, a need exists for a chassis and a method of cooling a chassis that provide sufficient cooling for electrical or electronic components in the chassis, without generating excessive acoustic noise during operation. A need also exists for a chassis and a method of cooling a chassis that provide sufficient cooling for electrical or electronic components, without allowing excessive electromagnetic radiation to escape from the chassis.

SUMMARY OF THE INVENTION

The present invention satisfies the above needs and achieves other advantages not present in conventional devices. According to a first aspect of the present invention, a chassis for housing components comprises a shell having an intake port, and intake duct in fluid communication with the intake port, an exhaust port, an exhaust duct in fluid communication with the intake duct and in fluid communication with the exhaust port, and at least one air moving device. At least one of the intake duct and the exhaust duct include a noise attenuating feature, the noise attenuating feature attenuating acoustic noise generated within the chassis.

According to the first aspect of the invention, acoustic noise generated within the chassis is reduced by the noise attenuating feature before the acoustic noise escapes the chassis. The chassis thus operates more quietly.

According to a second aspect of the present invention, a plenum may be provided within the chassis to distribute cooling air within the chassis. The plenum includes apertures oriented near preselected components or zones within the chassis, so that cooling air is directed onto the preselected components or zones.

According to the second aspect of the invention, cooling air is efficiently distributed in the chassis, which reduces the power requirements for the air moving device and/or reduces the number of air moving devices required to cool the chassis. The use of fewer and/or less powerful air moving devices reduces acoustic noise generated within the chassis.

According to a third aspect of the present invention, a chassis comprises a shell, an intake port in the shell, an intake duct in fluid communication with and disposed to receive a flow of cooling air from the intake port, an exhaust port in the shell in fluid communication with the intake duct, an exhaust duct disposed in fluid communication with the intake port and the exhaust port, and at least one air moving device in fluid communication with the intake and exhaust ports. At least one of the intake duct and the exhaust duct has a cross sectional area and a length selected so as to attenuate selected frequencies of electromagnetic radiation generated within the chassis.

According to the third aspect of the invention, electromagnetic radiation is attenuated in either the intake duct or the exhaust duct, and grilles with very small apertures need not be placed over the intake and exhaust ports to attenuate electromagnetic radiation. Therefore, cooling air flow is not restricted by the small apertures, and less powerful, quieter fans can be used to cool the chassis.

BRIEF DESCRIPTION OF THE DRAWING FIGURES

DETAILED DESCRIPTION OF THE PREFERRED EMBODIMENTS

Figure 1:
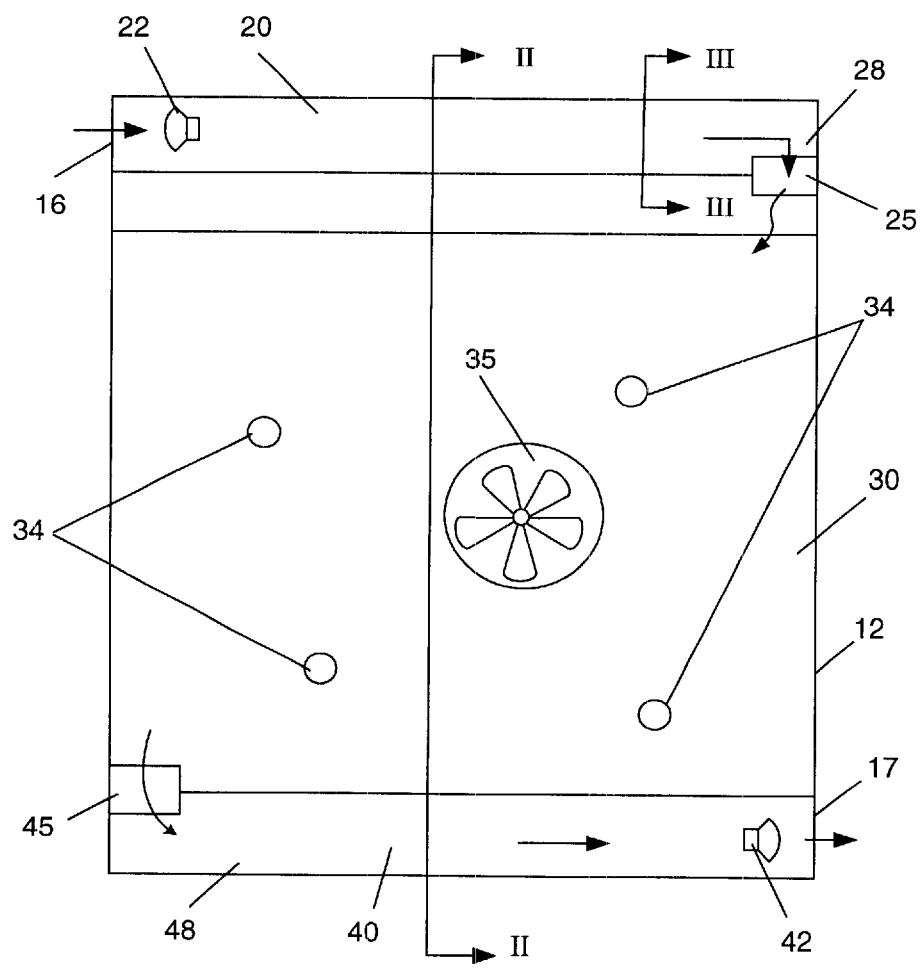
FIG. 1 is a partially exploded side view of a chassis according to an embodiment of the present invention.
Figure 2:
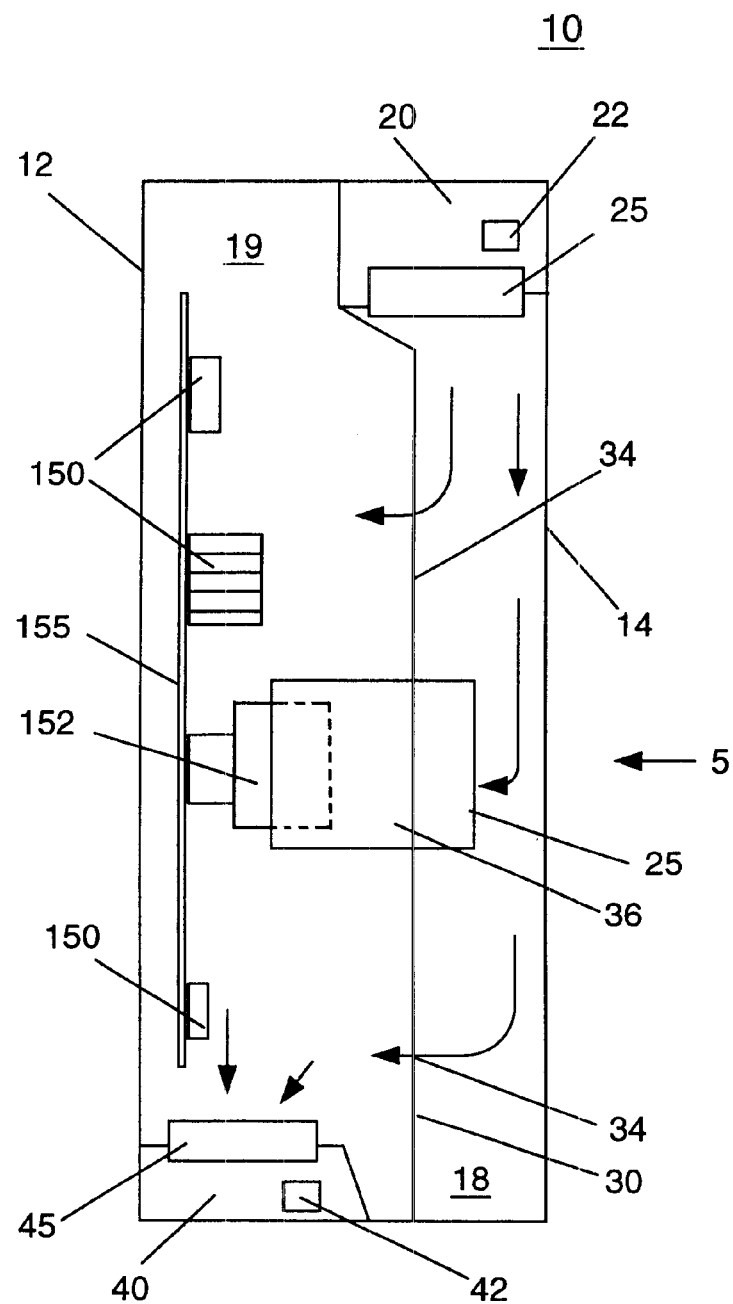
FIG. 2 is a sectional view taken on line II—II in FIG. 1.

FIG. 1 is a partially exploded side view of a chassis 10 according to an embodiment of the present invention. FIG. 1 is viewed from the direction of arrow 5 in FIG. 2, with a side 14 of a generally parallelepipedal shell 12 of the chassis 10 removed. FIG. 2 is a sectional view taken on line II—II in FIG. 1.

Referring to FIG. 1, the chassis 10 comprises the shell 12, an intake port 16 in the shell 12, an intake duct 20, an active intake noise cancellation device 22 located in the intake duct 20, a first air moving device 25, a plenum having apertures 34, a second air moving device 35, an exhaust duct 40, an active exhaust noise cancellation device 42 located in the exhaust duct 40, a third air moving device 45, and an exhaust port 17 in the shell 12. Referring to FIG. 2, the plenum 30 divides the chassis 10 into a first chamber 18 and a second chamber 19, with components 150 mounted to a circuit board 155 housed in the second chamber 19.

The flow of cooling air through the chassis 10 is indicated by the arrows in FIGS. 1 and 2. The chassis 10 produces a flow of cooling air over the components 150 as follows: the first through third air moving devices 25, 35, 45 draw air from outside of the chassis 10 through the intake port 16 into the intake duct 20. The air flows through the intake duct 20 to an interior end 28 of the intake duct 20, and subsequently through the first air moving device 25. The air then enters the first chamber 18 and flows through the apertures 34 in the plenum 30 into the second chamber 19, the apertures 34 being selectively located in the plenum 30 to direct cooling flows of air onto specific components 150, or zones, in the second chamber 19. The second air moving device 35 may be included on the plenum 30 to direct air onto a heat sink 152 via a duct 36. After the air has passed over the components 150, it enters an interior end 48 of the exhaust duct 40 via the third air moving device 45, and exits the chassis 10 through the exhaust port 17.

The use of a plenum 30 with the apertures 34 therein allows expected hot spots, critical components, especially heat-sensitive components, etc. on the circuit board 155 to receive a larger amount of cooling air flow than cooler or less vital areas of the circuit board 155. Because the cooling flow of air is more efficiently distributed by the plenum 30, a smaller cooling air flow is required for the chassis 10. Therefore, smaller air moving devices can be used, resulting in less acoustic noise generated in the chassis 10. A smaller required air flow also means that a smaller intake port 16, intake duct 20, exhaust port 17, or exhaust duct 40 may be used, which aids in the attenuation of electromagnetic radiation in the intake duct 20 and in the exhaust duct 40.

The duct 36 illustrated in FIG. 2 directs a strong cooling flow of air from the second air moving device 35 directly onto the heat sink 152. The chassis 10 may include one such duct 36, or, a plurality of ducts 36 can be arranged on the plenum 30, with each duct 36 being optionally coupled to a corresponding air moving device. In this arrangement, multiple points on the circuit board 155 can be cooled by a particularly strong flow a cooling air. For example, the circuit board 155 could include a plurality of heat sinks 152, each heat sink 152 being aligned within the chamber 19 to be cooled by a corresponding duct 36.

In FIGS. 1 and 2, the number and arrangement of apertures 34 in the plenum 30 is exemplary, and apertures 34 can be placed at any location on the plenum 30 to direct a cooling flow of air onto a specific component 150, or onto a desired area or zone of the circuit board 155.

In addition to the reduction in acoustic noise made possible by the use of the plenum 30, the intake duct 20 and the exhaust duct 40 act to attenuate acoustic noise before the noise escapes from the chassis 10. The intake duct 20 and the exhaust duct 40 also act to attenuate electromagnetic radiation before the radiation escapes from the chassis 10. The electromagnetic radiation attenuating aspect and the acoustic noise attenuating aspect of the present invention are each discussed below.

The electromagnetic radiation attenuating aspect of the intake duct 20 and the exhaust duct 40 will now be discussed with reference to FIGS. 3–6.

According to an embodiment of the present invention, the intake duct 20 and the exhaust duct 40 are dimensioned so as attenuate electromagnetic radiation generated within the chassis 10. The intake duct 20 and the exhaust duct 40 are the principal avenues of escape for electromagnetic radiation generated within the chassis 10, which may be otherwise substantially sealed to the escape of electromagnetic radiation. Therefore, attenuating electromagnetic radiation within the intake duct 20 and the exhaust duct 40 significantly reduces the amount of radiation escaping from the chassis 10. For the purposes of this specification, the description below of the electromagnetic attenuative properties of the present invention are limited to a discussion of the intake duct 20, although the principles discussed below also apply to the exhaust duct 40.

Because the intake duct 20 is in communication with the second chamber 19, the intake duct 20 acts as a waveguide for electromagnetic radiation generated by the components 150 within the second chamber 19. The intake duct 20 therefore serves as a path for the escape of electromagnetic radiation from the chassis 10. However, when traveling through the intake duct 20, electromagnetic radiation contacts the interior of the intake duct 20, and is attenuated by the contact because the interior surfaces of the intake duct 20 have electromagnetic attenuative properties (e.g. conductivity).

Figure 3:
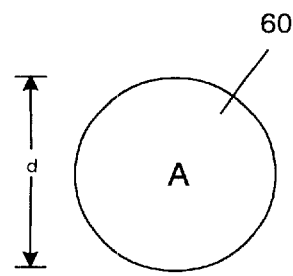
FIG. 3 is a sectional view of an alternative duct cross-section according to an embodiment of the present invention.
Figure 5:
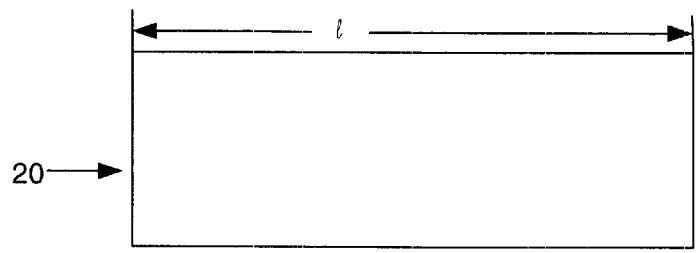
FIG. 5 is a side view of the intake duct illustrated in FIG. 3.

In general, the smaller the cross section, and the longer the length of the waveguide through which electromagnetic radiation travels, the greater the amount of the electromagnetic radiation that is attenuated in the waveguide. Further, the cross section of a waveguide can be specifically dimensioned to act as a high pass filter for selected frequencies of radiation traveling through the waveguide. A high pass filter allows only radiation having a frequency f greater than a cutoff frequency $f_{cutoff}$ to exit the waveguide. Radiation having a frequency f that is less than the cutoff frequency $f_{cutoff}$ is attenuated in the waveguide. Referring to FIG. 3, for a waveguide 60 having a circular cross section A of diameter d, the cutoff wavelength $\lambda_{cutoff}$ corresponding to a cutoff frequency $f_{cutoff}$ is described by the formula:

$$\lambda_{cutoff} = 3.412\, d$$

The cutoff frequency $f_{cutoff}$ is described by the formula:

$$f_{cutoff} = c/\lambda_{cutoff}$$

where c is the speed of light.

Figure 4:
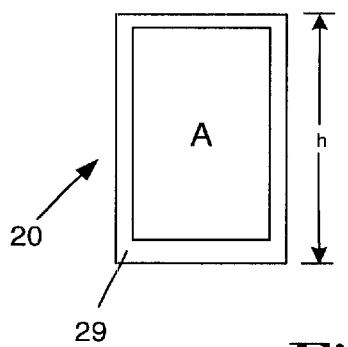
FIG. 4 is a sectional view taken on line III—III in FIG. 1.

Referring to FIG. 4, for a waveguide (the intake duct 20) having a rectangular cross section A, the cutoff wavelength $\lambda_{cutoff}$ corresponding to a cutoff frequency $f_{cutoff}$ is described by the formula:

$$\lambda_{cutoff} = 2\, h/m \text{ where}$$

h=the long dimension of the rectangular cross section A, and m=an integer factor.

The cross section of the intake duct 20 can be dimensioned according to these formulas so that radiation having a frequency below a desired cutoff frequency $f_{cutoff}$ is attenuated within the intake duct 20.

Figure 6:
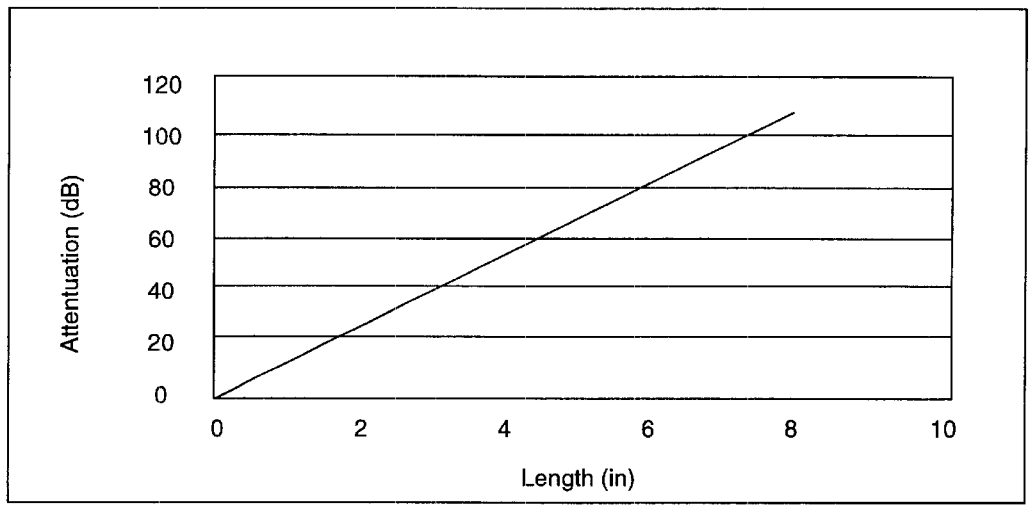
FIG. 6 is a plot illustrating radiation attenuation as a function of duct length.

The equations described above dictate which frequencies will be attenuated in a waveguide, but they do not indicate the amount of the electromagnetic radiation that is attenuated by the waveguide. FIG. 6 is a plot of such data, and illustrates the attenuation (in decibels) of a particular frequency of electromagnetic radiation, versus waveguide length for a waveguide of two inch diameter. In FIG. 6, the radiation being attenuated has a frequency $f = \frac{1}{2} f_{cutoff}$ for the waveguide.

Electromagnetic radiation of lower frequency f than $f_{cutoff}$ is attenuated to a much higher degree than higher frequency radiation. In this situation, the waveguide is said to operate as a "waveguide beyond cutoff." In addition, the amount of radiation attenuated within a waveguide increases with the length of the waveguide. It is therefore advantageous to utilize a small cross section for a waveguide, and to utilize a waveguide having a long length l.

The amount of attenuation L (in decibels) for radiation of wavelength λ in a waveguide having length l is given by the equation:

$$L = 54.5 (l/\lambda_{cutoff}) [1 - (\lambda_{cutoff}/\lambda)^2]^{0.5}$$

Therefore, attenuation increases linearly with increasing waveguide length l, as illustrated by FIG. 6. It is therefore advantageous to interpose the intake duct 20 between the interior of the chassis 10 and the intake port 16, because electromagnetic radiation having a frequency below the cutoff frequency is attenuated along the length l of the intake duct 20.

The above embodiments of the present invention therefore possess a significant advantage over conventional chassis which utilize grilles to prevent electromagnetic radiation from escaping the chassis. A conventional grille is very thin, and therefore the diameter of the apertures in the grille must be very small in order to block a sufficient amount of electromagnetic radiation. The small apertures restrict air flow through the grille, which requires the use of larger, more powerful fans to cool the chassis, resulting in undesirable acoustic noise.

According to the present invention, the cutoff frequency $f_{cutoff}$ and the length l of the intake duct 20 may be selected such that the bulk of the electromagnetic radiation generated within the chassis 10 has a frequency below the cutoff frequency, so that only acceptable amounts of higher frequency electromagnetic radiation escape the chassis 10 through the intake duct 20 and through the exhaust duct 40. The $\lambda_{cutoff}$ and l for the intake duct 20 should be selected so that the amount of electromagnetic radiation escaping from the chassis 10 is less than a desired maximum allowable amount.

The amount and/or frequencies of radiation to be attenuated within the intake duct 20 and the exhaust duct 40 are specific to particular applications. Therefore, the cross sectional shape and size of the ducts, the duct lengths, and other structural characteristics of the ducts may be varied to obtain desired attenuation characteristics.

The chassis 10 is illustrated as housing components 150 on a circuit board 155. However, the chassis 10 according to embodiments of the present invention is not restricted to housing integrated circuitry. For example, any heat generating components 150 can be housed in the chassis 10 and cooled during operation. These components may generate electromagnetic radiation at differing frequencies than, for example, a personal computer. It is within the scope of the present invention to vary the configuration of the intake duct 20 and the exhaust duct 40 in order to attenuate differing frequencies of radiation.

The previous discussion was directed to the intake duct 20. However, the principles used in determining the configuration of the intake duct 20 are applicable to the exhaust duct 40.

In order to minimize the escape of electromagnetic radiation from the chassis 10, the chassis 10 should be constructed of material having electromagnetic attenuative properties. Examples of electromagnetic attenuative materials are steel, aluminum, etc. Alternatively, the chassis 10 can be constructed of a plastic or other non-metallic material that has been coated or covered with an electromagnetic attenuative material. Other than the intake port 20 and the exhaust port 40, the chassis 10 should be substantially sealed to minimize the escape of electromagnetic radiation.

In addition to acting as a high pass filter, the intake duct 20 and the exhaust duct 40 function to attenuate acoustic noise generated within the chassis 10 before the acoustic noise escapes the chassis 10. Specifically, the intake duct 20 and the exhaust duct 40 provide a location for accommodating both passive and active noise attenuating features. Both the passive and the active noise attenuating features are discussed below.

The passive noise attenuating features of the intake duct 20 will be discussed with reference to FIGS. 4 and 7–10. The discussion below is addressed to passive noise attenuating features in the intake duct 20. However, the principles of acoustic noise attenuation are also applicable to the exhaust duct 40, and for the purposes of illustration, a detailed discussion of the structure of the exhaust duct 40 is omitted.

Referring to FIG. 4, a layer of sound attenuating material 29 can be placed over the interior surfaces of the intake duct 20 to attenuate acoustic noise generated within the chassis 10. The layer of sound attenuating material 29 can be relatively thin sheets of polymer acoustic foam secured to the interior of the intake duct 29 by, for example, adhesive. Other suitable materials for the layer of sound attenuating material 29 include fiberglass, polyester foam, melamine foam, and similar materials. The layer of sound attenuating material 29 can also be used to cover all or a part of the remaining interior surfaces of the chassis 10, including the exhaust duct 40, thereby reducing the amount of acoustic noise passing from the interior to the exterior of the chassis 10. The layer of sound attenuating material 29 need not be a single, contiguous layer, and can instead be selectively applied in sections.

FIGS. 7–10 illustrate duct configurations having passive noise attenuating features, the illustrated embodiments being appropriate for use as either intake ducts or exhaust ducts.

Figure 7:
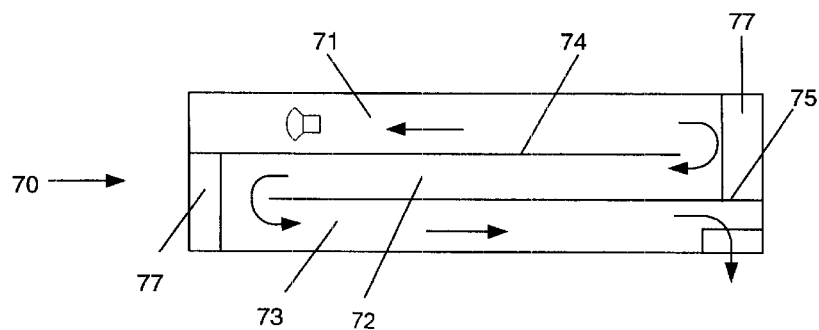
FIG. 7 is a sectional view of an alternative duct according to an embodiment of the present invention.

FIG. 7 illustrates an alternative duct 70 according to an embodiment of the present invention. The duct 70 includes first, second and third interconnected passageways 71, 72, 73, separated by first and second dividing walls 74, 75. The first through third passageways 71, 72, 73 establish a tortuous path for acoustic noise traveling through the duct 70, and acoustic noise may be attenuated in the duct 70 by a layer of sound attenuating material (not illustrated) applied to interior surfaces of the duct 70.

In addition to a layer of sound attenuating material, relatively thick blocks of sound attenuating material 77 are located at the ends of the first through third passageways 71, 72, 73. The blocks of sound attenuating material 77 attenuate acoustic noise as it changes direction while traveling through the duct 70. The blocks of sound attenuating material 77 can be a low density material such as acoustic foam, which can be formed from, for example, a polymer material.

Figure 8:
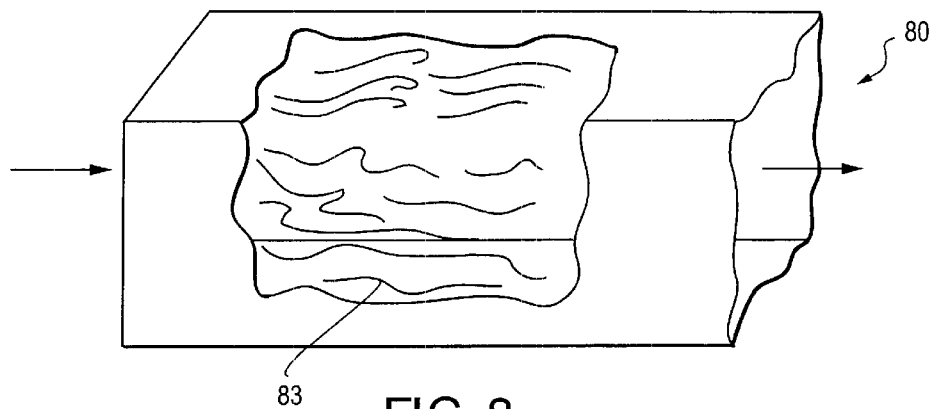
FIG. 8 is a cutaway perspective view of an alternative duct according to an embodiment of the present invention.

FIG. 8 is a cutaway perspective view of an alternative duct 80 according to an embodiment of the present invention. The duct 80 includes loosely packed, air-permeable sound attenuating material 83 disposed within the duct 80. The sound attenuating material 83 can be a low density material such as fiberglass. The sound attenuating material 83 need not extend the full length of the duct 80, and can be applied in sections within the duct 80. The sound attenuating material 83 allows cooling air to flow through the duct 80 while attenuating acoustic noise generated within the chassis 10. A relatively short section of sound attenuating material 83, preferably extending across the cross section of the duct 80, serves to attenuate acoustic noise in the duct 80.

Figure 9:
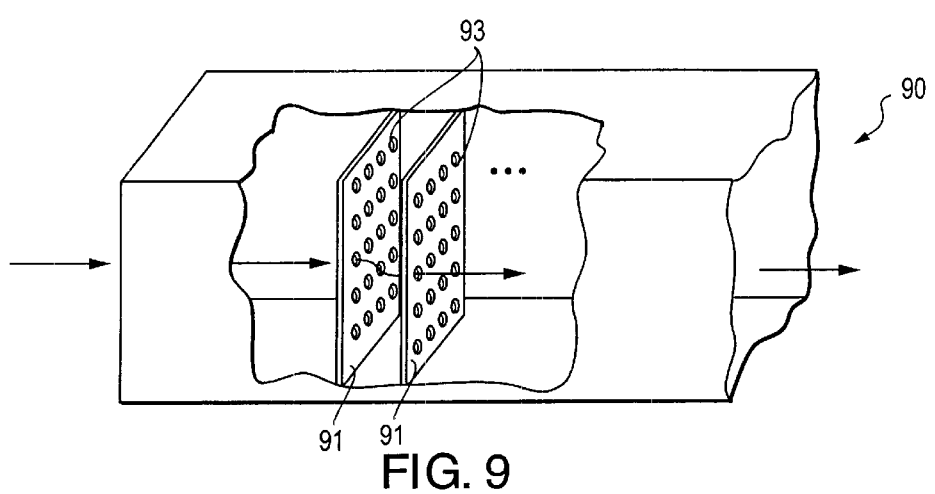
FIG. 9 is a cutaway perspective view of an alternative duct according to an embodiment of the present invention.

FIG. 9 is a cutaway perspective view of an alternative duct 90 according to an embodiment of the present invention. The duct 90 includes a plurality of baffles 91 longitudinally spaced within the duct 90. For the purposes of illustration, only two baffles 91 are illustrated, but a large number of baffles 91 arranged at small longitudinal intervals are within the scope of the present invention. The baffles 91 include a plurality of apertures 93 that allow air to flow through the baffles 91. The apertures 93 of one baffle 91 are offset from a neighboring baffle 91, so that air flow must change direction as it travels through baffles 91. This alignment further attenuates acoustic noise generated within the chassis 10.

Figure 10:
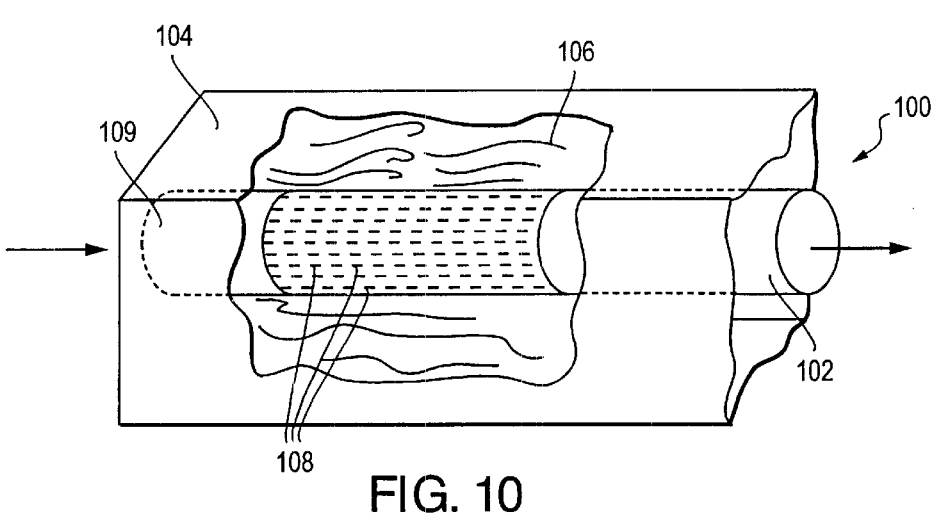
FIG. 10 is a cutaway perspective view of an alternative duct according to an embodiment of the present invention.

FIG. 10 is a cutaway perspective view of an alternative duct 100 according to an embodiment of the present invention. The duct 100 includes an inner passageway 102 and an outer passageway 104, the outer passageway 104 being coaxially aligned with the inner passageway 102. The inner passageway 102 and the outer passageway 104 can be formed from tubes of any cross-section. The inner passageway 102 includes apertures 108 disposed around its periphery. Sound attenuating material 106 is disposed between the inner passageway 102 and the outer passageway 104 in order to attenuate acoustic noise escaping from the inner passageway 102. The sound attenuating material 106 can be low density material such as elastomeric materials, foams, etc.

If the duct 100 is used as an intake duct, an intake end 109 of the inner passageway 102 is arranged in fluid communication with the intake port 16. If used as an exhaust duct, the intake end 109 of the inner passageway is in fluid communication with the exhaust port 17.

In the alternative ducts illustrated in FIGS. 7–10, the passageways in the ducts 70, 80, 90, 100 may be dimensioned to act as high pass filters. Therefore, both electromagnetic radiation and acoustic noise may be attenuated in the ducts 70, 80, 90, 100.

The duct embodiments illustrated in FIGS. 7–10 are exemplary of the principles embodied by the present invention, and the present embodiment is not intended to be limited to the illustrated embodiments.

Active noise cancellation in embodiments of the present invention will now be discussed with reference to FIGS. 1, 2 and 7.

Referring to FIG. 1, the chassis 10 includes an active intake noise cancellation device 22 disposed within the intake duct 20 and an active exhaust noise cancellation device 42 disposed within the exhaust duct 40. Active noise cancellation will be discussed with reference to the active intake noise cancellation device 22, but the principles are equally applicable to the active exhaust noise cancellation device 42.

The active intake noise cancellation device 22 cancels acoustic noise by sensing the orientation of acoustic noise traveling down the intake duct 20, and producing an acoustic signal to cancel the acoustic noise. The acoustic signal is generated to be of equal magnitude and frequency to the acoustic noise, but 180 degrees out of phase with the acoustic noise. Therefore, the acoustic noise and the acoustic signal cancel one another.

The active intake noise cancellation device 22 is most effective when disposed in the intake duct 20 at or near the intake port 16. This is so because the acoustic noise must travel down the intake duct 20 before exiting the chassis 10 through the intake port 16, which "channels" the acoustic noise before it passes through the intake port 16. The active intake noise cancellation device 22 can more effectively cancel acoustic noise that is restricted to an area defined by the cross section of the intake duct 22. Therefore, by placing the active intake noise cancellation device 22 near the intake port 16, the device 22 can sense relatively coherent acoustic noise just prior to its exit from the chassis 10, and more effectively cancel the acoustic noise using an acoustic signal.

Similar to the active intake noise cancellation device 22, the active exhaust noise cancellation device 42 is preferably located at or near the exhaust port 17.

The active intake noise cancellation device 22 and the active exhaust noise cancellation device 42 can be employed in any of the duct embodiments disclosed in FIGS. 1–10. In addition, multiple active noise cancellation devices can be placed within the intake duct 20 or within the exhaust duct 40.

In the above embodiments of the present invention, the chassis 10 is illustrated as including first through third air moving devices 25, 35, 34. However, fewer or more air moving devices can be used in the present invention. For example, a single air moving device could be placed in fluid communication with either the intake duct 20 or the exhaust duct 40 and create a pressure head sufficient to force air through the chassis 10. Alternatively, four, five, or more air moving devices could be mounted in selected locations within the chassis 10.

In addition, the apertures 34 in the plenum 30 need not be disposed to direct air flow onto specific components 150, but may be distributed on the plenum 30 to evenly distribute cooling air flow over an area, such as over the circuit board 155.

The embodiments of the chassis 10 discussed above include both an intake duct 20 and an exhaust duct 40. This is not limitive of the present invention because either an intake duct 20 alone or an exhaust duct 40 alone would reduce the escape of electromagnetic radiation and sound energy (e.g. acoustic noise) from the chassis 10. For example, an intake duct 20 could be employed to draw air into the chassis 10, and the air could flow directly from the second chamber 19 out of the chassis 10 through exhaust ports in the shell 12. If an exhaust duct 40 is not used in the chassis 10, the exhaust ports in the shell should be configured so as to inhibit the escape of electromagnetic radiation from the chassis 10. Similarly, an exhaust duct 40 could be used in conjunction with intake ports in the shell 12, with air being drawn directly from the intake ports into the first chamber 18. If an intake duct 20 is not used in the chassis 10, the intake ports should be configured to inhibit the escape of electromagnetic radiation from the chassis 10.

In FIGS. 1 and 2, the intake duct 20 and the exhaust duct 40 are illustrated as being integral with the shell 12. However, either or both of the intake duct 20 and the exhaust duct 40 may be a separate, enclosed passageway mountable within the shell 12.

While the present invention is described with reference to exemplary embodiments, it will be understood that many modifications will be readily apparent to those skilled in the art, and the present disclosure is intended to cover variations thereof.

What is claimed is:

1. A chassis for housing components, the chassis comprising:
    a shell;
    an intake port in the shell;
    an intake duct in fluid communication with the intake port;
    an exhaust port in the shell;
    an exhaust duct in fluid communication with the intake duct and in fluid communication with the exhaust port, at least one of the intake duct and the exhaust duct including a noise attenuating feature, the noise attenuating feature attenuating acoustic noise generated within the chassis; and
    at least one air moving device in fluid communication with the intake port and the exhaust port and capable of moving air from the intake port through the chassis to the exhaust port to cool components housed in the chassis,
    wherein at least one of the intake duct and the exhaust duct comprise at least two interconnected passageways, the interconnected passageways being arranged to redirect air flow, the noise attenuating feature comprising sound attenuating material that allows air to pass therethrough and being disposed to attenuate acoustic noise in the interconnected passageways.

2. The chassis of claim 1, wherein at least one of the intake duct and the exhaust duct has a cross sectional area and a length selected so as to attenuate selected frequencies of electromagnetic radiation generated within the chassis.

3. The chassis of claim 1, further comprising a plenum disposed between the intake duct and the exhaust duct, the plenum having apertures for directing air flow from the intake duct onto selected components housed in the chassis.

4. The chassis of claim 3, wherein the at least one air moving device comprises a second air moving device disposed at the plenum.

5. The chassis of claim 1, wherein the shell is generally parallelepipedal, the intake duct extending along a first side of the shell, and the exhaust duct extending along a second side of the shell.

6. The chassis of claim 5, wherein the intake duct extends for more than half of the length of the first side of the shell; and the exhaust duct extends for more than half of the length of the second side of the shell.

7. The chassis of claim 1, wherein the noise attenuating feature comprises sound attenuating material, the sound attenuating material allowing air to pass therethrough.

8. The chassis of claim 1, wherein the noise attenuating feature comprises intake baffles within the intake duct, the intake baffles including a plurality of apertures that allow air to pass through the intake baffles and that attenuate acoustic noise within the intake duct.

9. The chassis of claim 1, wherein the noise attenuating feature comprises a first tube defining an inner passageway and a second tube defining an outer passageway, the first tube being disposed at least partially within the second tube.

10. The chassis of claim 1, wherein the noise attenuating feature comprises sound attenuating material disposed on an interior surface of at least one of the intake duct and the exhaust duct.

11. The chassis of claim 1, wherein the noise attenuating feature comprises at least one active noise cancellation device, the active noise cancellation device being capable of generating a signal to at least partially cancel acoustic noise.

12. A chassis for housing components, the chassis comprising:
    a shell;
    an intake port in the shell;
    an intake duct in fluid communication with and disposed to receive a flow of cooling air from the intake port;
    an exhaust port in the shell in fluid communication with the intake duct;
    an exhaust duct disposed in fluid communication with the intake duct and the exhaust port, the exhaust duct disposed to direct a flow of air from an interior of the chassis to the exhaust port, at least one of the intake duct and the exhaust duct having a cross sectional area and a length selected so as to attenuate selected frequencies of electromagnetic radiation generated within the chassis; and
    at least one air moving device in fluid communication with the intake port and the exhaust port and capable of moving air through the chassis to cool components housed in the chassis,
    wherein at least one of the intake duct and the exhaust duct include a noise attenuating feature and comprise at least two interconnected passageways, the interconnected passageways being arranged to redirect air flow, the noise attenuating feature comprising sound attenuating material that allows air to pass therethrough and being disposed to attenuate acoustic noise in the interconnected passageways.

13. The chassis of claim 12, wherein the shell is generally parallelepipedal, the intake duct extending along a first side of the shell, and the exhaust duct extending along a second side of the shell.

14. The chassis of claim 13, wherein the intake duct extends for more than half of the length of the first side of the shell, and the exhaust duct extends for more than half of the length of the second side of the shell.

15. The chassis of claim 12, wherein at least one of the intake duct and the exhaust duct has a cross sectional area selected so as to act as a high pass filter for electromagnetic radiation generated within the chassis.

16. A method of cooling components within a chassis having a shell, an intake port, an intake duct, an exhaust duct, and an exhaust port, the method comprising:

drawing air from outside of the chassis through the intake port into the intake duct using at least one air moving device;

passing the air over components disposed within the chassis;

drawing air through the exhaust duct using the at least one air moving device, at least one of the intake duct and the exhaust duct including a noise attenuating feature;

attenuating acoustic noise generated within the chassis using the noise attenuating feature;

passing the air from the exhaust duct through the exhaust port to outside of the chassis;

redirecting air flow via at least two interconnected passageways in at least one of the intake duct and the exhaust duct; and using as the noise attenuating feature a sound attenuating material that allows air to pass therethrough and is disposed to attenuate acoustic noise in the interconnected passageways.

17. The method of claim 16, further comprising:

distributing the air within the chassis by passing the air through apertures in a plenum after the air has passed through the intake duct.

18. The method of claim 16, wherein the noise attenuating feature comprises at least one active noise cancellation device, the method further comprising:

sensing acoustic noise generated within the chassis; and generating a signal with the active noise cancellation device to at least partially cancel the acoustic noise.

* * * * *